(12) United States Patent
Kobayashi

(10) Patent No.: US 8,063,705 B1
(45) Date of Patent: Nov. 22, 2011

(54) PUSH-PULL TRANSIMPEDANCE AMPLIFIER

(75) Inventor: Kevin W. Kobayashi, Torrance, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 6 days.

(21) Appl. No.: 12/684,572

(22) Filed: Jan. 8, 2010

Related U.S. Application Data

(60) Provisional application No. 61/143,308, filed on Jan. 8, 2009.

(51) Int. Cl.
H03F 3/08 (2006.01)

(52) U.S. Cl. ........................................................ 330/308

(58) Field of Classification Search .................. 330/308, 330/110, 98, 133, 150; 250/214 A
See application file for complete search history.

(56) References Cited

U.S. PATENT DOCUMENTS

| 6,057,738 | A | * | 5/2000 | Ku et al. ........................ 330/308 |
| 6,069,534 | A | | 5/2000 | Kobayashi |
| 6,404,281 | B1 | | 6/2002 | Kobayashi |
| 6,504,429 | B2 | | 1/2003 | Kobayashi |
| 6,590,455 | B1 | | 7/2003 | Kobayashi |

OTHER PUBLICATIONS van den Broeke, L.A.D. et al., "Wide-band integrated optical receiver with improved dynamic range using a current switch at the input," IEEE Journal of Solid-State Circuits, Jul. 1993, pp. 862-864, vol. 28, No. 7, IEEE.

Vanrisi, T. et al., "Integrated high frequency low-noise current-mode optical transimpedance preamplifiers: theory and practice," IEEE Journal of Solid-State Circuits, Jun. 1995, pp. 667-685, vol. 30, No. 6, IEEE.

* cited by examiner

Primary Examiner — Hieu Nguyen
(74) Attorney, Agent, or Firm — Withrow & Terranova, P.L.L.C.

(57) ABSTRACT

The present disclosure relates to a push-pull transimpedance amplifier (TIA) that receives a push-pull radio frequency (RF) input current signal having a push current and a pull current and includes a common-emitter pre-amplifier and a dynamic feedback current source (DFCS). The common-emitter pre-amplifier receives at least a portion of the push current and provides a first RF signal based on amplifying the push-pull RF input current signal. The DFCS provides at least a portion of the pull current based on the first RF signal. The push-pull TIA may operate at high data rates, may have high input sensitivity, may provide linear amplification of the push-pull RF input current signal, or any combination thereof. The push-pull TIA may provide an RF output signal based on amplifying the push-pull RF input current signal.

23 Claims, 8 Drawing Sheets

PUSH-PULL TRANSIMPEDANCE AMPLIFIER

This application claims the benefit of provisional patent application Ser. No. 61/143,308, filed Jan. 8, 2009, the disclosure of which is hereby incorporated herein by reference in its entirety.

FIELD OF THE DISCLOSURE

Embodiments of the present disclosure relate to push-pull input transimpedance amplifiers, which may be used in fiber optics based communications systems.

BACKGROUND OF THE DISCLOSURE

Spectrally efficient fiber optics communications systems may evolve toward using differential phase shift keying (DPSK) modulation, differential quadrature phase shift keying (DQPSK) modulation, or both of a fiber optics signal. Detection of such a modulated signal may be achieved using either a twin photo-diode detector or a stacked photo-diode push-pull detector followed by a transimpedance amplifier (TIA). The stacked photo-diode push-pull detector may be preferable over the twin photo-diode detector due to ease of implementation and inherent match of adjacent monolithic photo-detectors, which may provide superior DPSK or DQPSK demodulation. However, when using the stacked photo-diode push-pull detector, for optimum performance, a TIA is needed that has both high input sensitivity and has linear push-pull input current handling capability. Further, fiber optics communications systems are evolving toward increasing data rates. Data rates above 100 gigabits-per-second (Gbps) are desirable. As such, a TIA is needed that operates at high data rates, has high input sensitivity, and has linear push-pull input current handling capability.

Present push-pull input TIAs may use complementary technologies that may limit data rates to less than 10 Gbps due to limited hole mobility of P-type metal-oxide-semiconductor (PMOS) or PNP transistor technologies. A common-emitter input TIA may eliminate the use of PMOS or PNP transistor technologies. However, such a TIA is a push only TIA that can accommodate only push input currents and cannot accommodate pull input currents without significantly degrading linearity. To provide pull input currents, a common-emitter input TIA may include a shunt input resistor in parallel with the stacked photo-diode push-pull detector to provide pull input currents. However, the shunt input resistor may contribute excessive input-referred current noise, which may degrade input sensitivity of the TIA. Alternatively, to provide pull input currents, the common-emitter input TIA may include a single-ended common-base input stage to provide input pull currents. However, the single-ended common-base input stage may require a large quiescent current that results in high input shot noise, which may degrade the input sensitivity of the TIA. As such, there remains a need for a TIA that operates at high data rates, has high input sensitivity, and has linear push-pull input current handling capability to provide linear amplification of a push-pull radio frequency (RF) input current signal.

SUMMARY OF THE EMBODIMENTS

The present disclosure relates to a push-pull transimpedance amplifier (TIA) that receives a push-pull RF input current signal having a push current and a pull current and includes a common-emitter pre-amplifier and a dynamic feedback current source (DFCS). The common-emitter pre-amplifier receives at least a portion of the push current and provides a first RF signal based on amplifying the push-pull RF input current signal. The DFCS provides at least a portion of the pull current based on the first RF signal. The push-pull TIA may operate at high data rates, may have high input sensitivity, may provide linear amplification of the push-pull RF input current signal, or any combination thereof. The push-pull TIA may provide an RF output signal based on amplifying the push-pull RF input current signal.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to a push-pull transimpedance amplifier (TIA) that receives a push-pull RF input current signal having a push current and a pull current and includes a common-emitter pre-amplifier and a dynamic feedback current source (DFCS). The common-emitter pre-amplifier receives at least a portion of the push current and provides a first RF signal based on amplifying the push-pull RF input current signal. The DFCS provides at least a portion of the pull current based on the first RF signal. The push-pull TIA may operate at high data rates, may have high input sensitivity, may provide linear amplification of the push-pull RF input current signal, or any combination thereof. The push-pull TIA may provide an RF output signal based on amplifying the push-pull RF input current signal.

Figure 1:
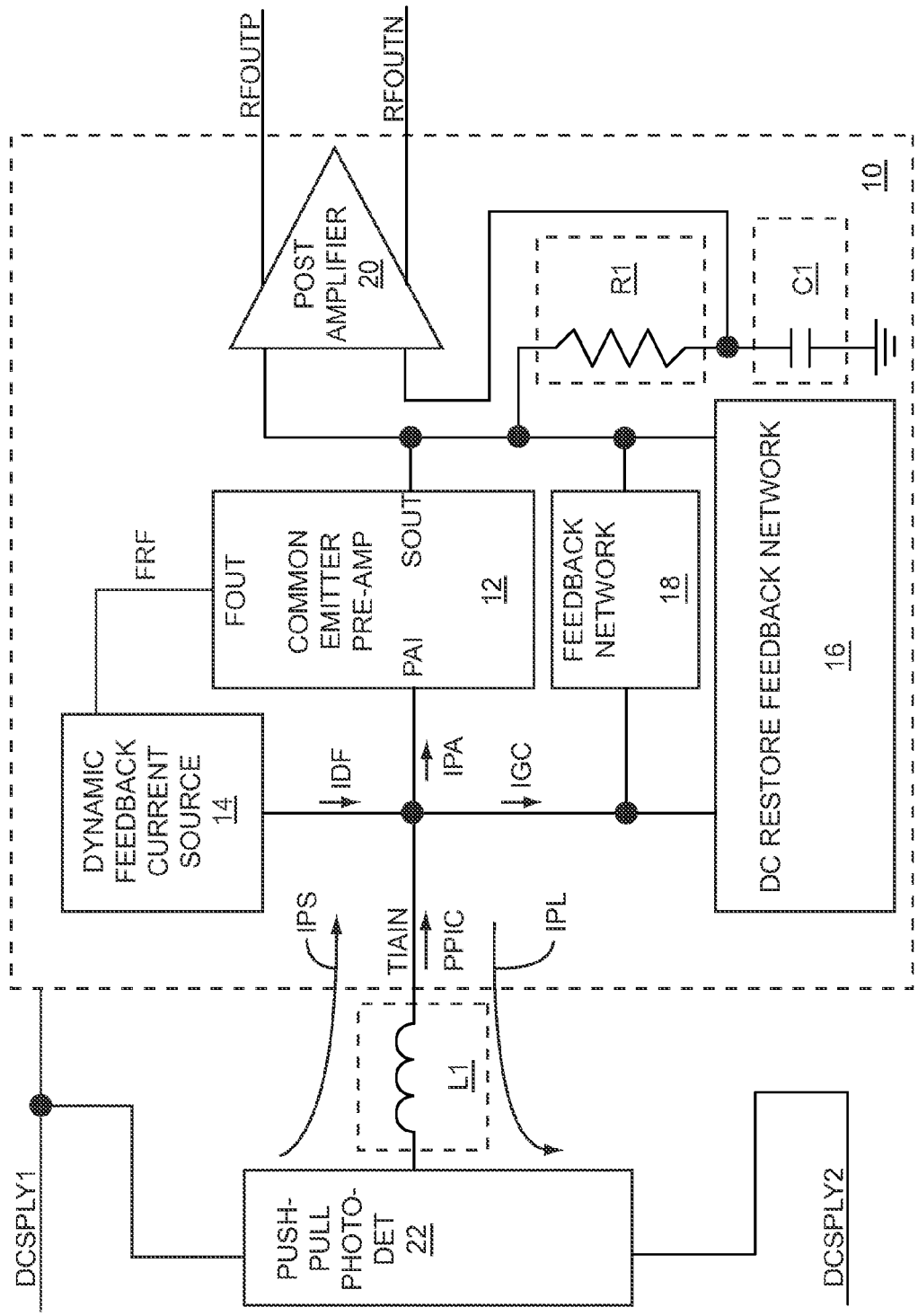
FIG. 1 shows a push-pull transimpedance amplifier (TIA) according to one embodiment of the push-pull TIA.

FIG. 1 shows a push-pull TIA 10 according to one embodiment of the push-pull TIA 10. The push-pull TIA 10 includes a common emitter pre-amplifier 12, a DFCS 14, a DC restore feedback network 16, a feedback network 18, a post amplifier 20, a first resistive element R1, a first capacitive element C1, and a TIA input TIAIN. A push-pull photo-detector 22 is coupled to the TIA input TIAIN through a first inductive element L1, which may be provided by a wirebond between the push-pull photo-detector 22 and the TIA input TIAIN. The common emitter pre-amplifier 12 has a pre-amplifier input PAI, a first output FOUT, and a second output SOUT. The TIA input TIAIN is coupled to the pre-amplifier input PAI. The DFCS 14 is coupled between the pre-amplifier input PAI and the first output FOUT. The DC restore feedback network 16 is coupled between the pre-amplifier input PAI and the second output SOUT. The feedback network 18 is coupled between the pre-amplifier input PAI and the second output SOUT. The post amplifier 20 is a differential amplifier having differential inputs and differential outputs. The first resistive element R1 is coupled between the differential inputs of the post amplifier 20. The second output SOUT is coupled to one of the differential inputs of the post amplifier 20 and the first capacitive element C1 is coupled between the other of the differential inputs of the post amplifier 20 and ground.

The push-pull photo-detector 22 is coupled between a first DC supply DCSPLY1 and a second DC supply DCSPLY2, and provides a push-pull RF input current signal PPIC having a push current IPS and a pull current IPL to the push-pull TIA 10. The TIA input TIAIN receives the push-pull RF input current signal PPIC. The DFCS 14 provides a dynamic feedback current IDF, the pre-amplifier input PAI receives a pre-amplifier input current IPA, and the DC restore feedback network 16 and the feedback network 18 receive a gain control current IGC. The pre-amplifier input PAI receives at least a portion of the push current IPS and the first output FOUT provides a first RF signal FRF to the DFCS 14 based on amplifying the push-pull RF input current signal PPIC. The DFCS 14 provides at least a portion of the pull current IPL based on the first RF signal FRF. Further, the push current IPS and the pull current IPL are predominantly RF currents. In one embodiment of the push-pull TIA 10, the dynamic feedback current IDF provides a dominant part of the pull current IPL and the pre-amplifier input current IPA receives a dominant part of the push current IPS. Current received by the DC restore feedback network 16 may be predominantly DC current.

The second output SOUT provides a single-ended output signal to the post amplifier 20 based on amplifying the push-pull RF input current signal PPIC. The first resistive element R1 and the first capacitive element C1 convert the single-ended output signal into a differential signal, which is fed into the differential inputs to the post amplifier 20, which amplifies the differential signal to provide an RF output signal based on amplifying the push-pull RF input current signal PPIC. The RF output signal is a differential RF output signal having a positive-side RF output signal RFOUTP and a negative-side RF output signal RFOUTN. In general, the post amplifier 20 is coupled to the common emitter pre-amplifier 12 and receives and amplifies an amplified signal from the common emitter pre-amplifier 12 to provide the RF output signal.

The DFCS 14 may detect a polarity of the first RF signal FRF and may provide at least a portion of the pull current IPL based on the detected polarity of the first RF signal FRF. The DC restore feedback network 16 may provide DC leveling of the common emitter pre-amplifier 12 as a magnitude of the push-pull RF input current signal PPIC increases. The push-pull TIA 10 may provide linear amplification of the push-pull RF input current signal PPIC. Further, the push-pull TIA 10 may provide non-saturated linear amplification of the push-pull RF input current signal PPIC. Alternatively, the push-pull TIA 10 may operate in compression, such that a portion of the push-pull RF input current signal saturates.

In a first exemplary embodiment of the push-pull TIA 10, an operating frequency of the push-pull RF input current signal PPIC is greater than about 50 gigahertz. In a second exemplary embodiment of the push-pull TIA 10, an operating frequency of the push-pull RF input current signal PPIC is greater than about 100 gigahertz. In a third exemplary embodiment of the push-pull TIA 10, an operating frequency of the push-pull RF input current signal PPIC is greater than about 200 gigahertz. In a fourth exemplary embodiment of the push-pull TIA 10, an operating frequency of the push-pull RF input current signal PPIC is greater than about 300 gigahertz. To facilitate high frequency operation, in one embodiment of the push-pull TIA 10, neither the common emitter pre-amplifier 12 nor the DFCS 14 includes any P-type metal-oxide-semiconductor (PMOS) or PNP transistor technologies, thereby avoiding frequency limitations imposed by limited hole mobilities associated with such technologies.

Figure 2:
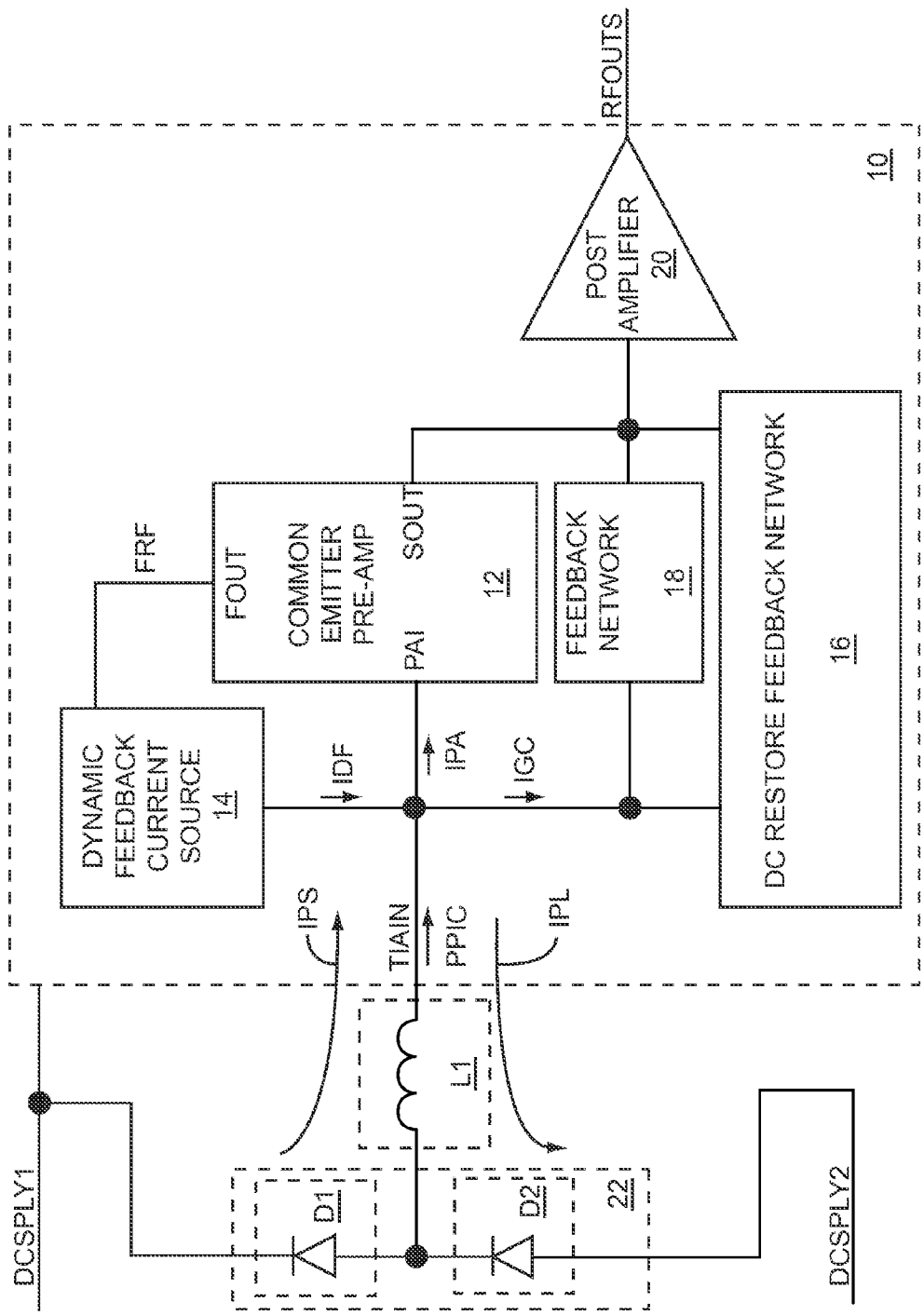
FIG. 2 shows the push-pull TIA and details of a push-pull photo-detector according to an alternate embodiment of the push-pull TIA and one embodiment of the push-pull photo-detector.

FIG. 2 shows the push-pull TIA 10 and details of the push-pull photo-detector 22 according to an alternate embodiment of the push-pull TIA 10 and one embodiment of the push-pull photo-detector 22. The push-pull photo-detector 22 includes a first photo-diode D1 and a second photo-diode D2. A cathode of the first photo-diode D1 is coupled to the first DC supply DCSPLY1, an anode of the first photo-diode D1 is coupled to a cathode of the second photo-diode D2, and an anode of the second photo-diode D2 is coupled to the second DC supply DCSPLY2. The first photo-diode D1 may provide the push current IPS and the second photo-diode D2 may provide the pull current IPL.

The push-pull TIA 10 illustrated in FIG. 2 is similar to the push-pull TIA 10 illustrated in FIG. 1, except in the push-pull TIA 10 illustrated in FIG. 2, the post amplifier 20 is a single-ended amplifier instead of the differential amplifier illustrated in FIG. 1. As such, the first resistive element R1 and the first capacitive element Cl are omitted. The second output SOUT provides a single-ended output signal to the post amplifier 20 based on amplifying the push-pull RF input current signal PPIC. The post amplifier 20 amplifies the single-ended output signal to provide an RF output signal, which is a single-ended RF output signal RFOUTS.

Figure 3:
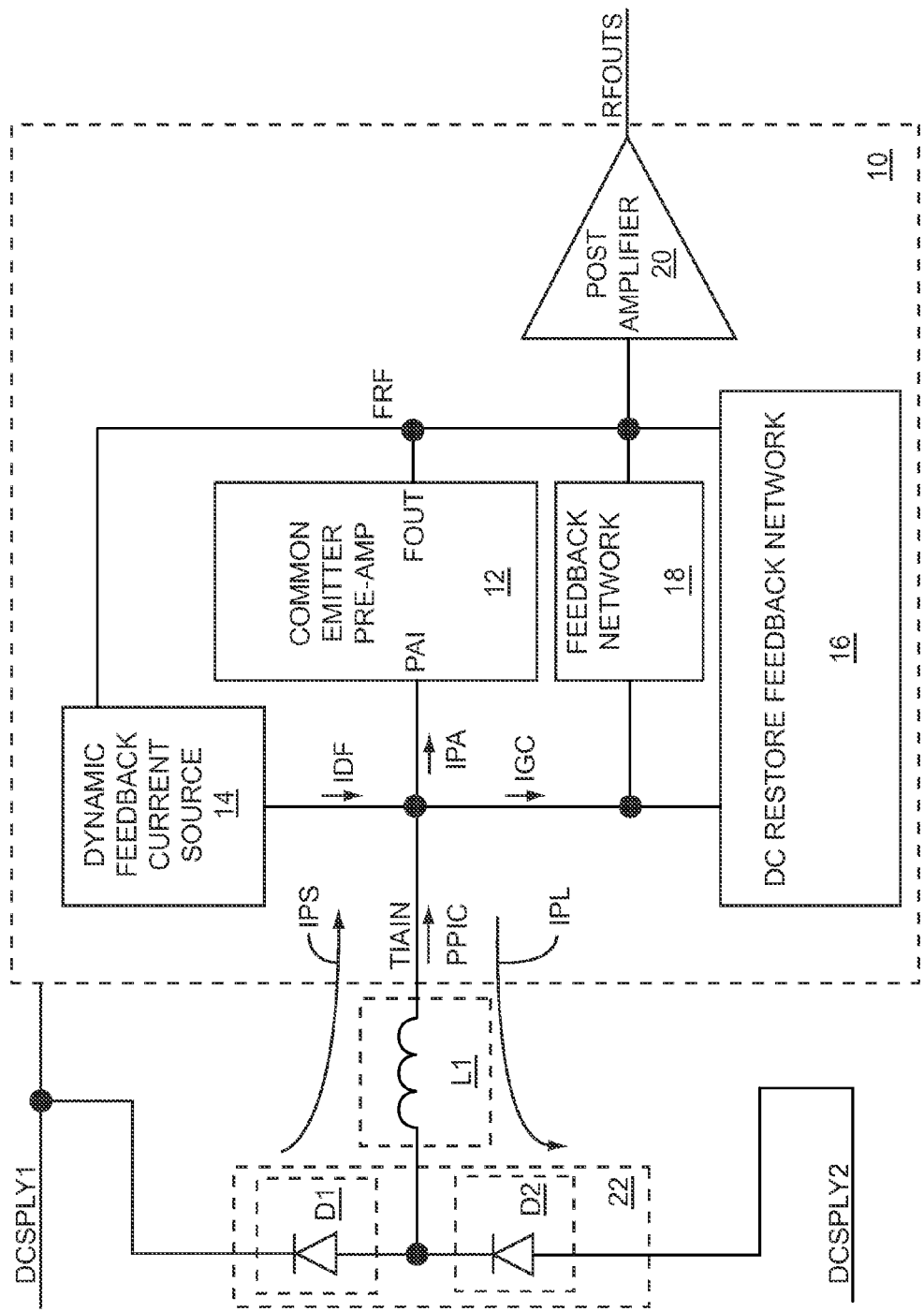
FIG. 3 shows the push-pull TIA according to an additional embodiment of the push-pull TIA.

FIG. 3 shows the push-pull TIA 10 according to an additional embodiment of the push-pull TIA 10. The push-pull TIA 10 illustrated in FIG. 3 is similar to the push-pull TIA 10 illustrated in FIG. 2, except in the push-pull TIA 10 illustrated in FIG. 3, the second output SOUT is omitted. Instead of being coupled to the second output SOUT, the post amplifier 20, the feedback network 18, and the DC restore feedback network 16 are coupled to the first output FOUT. As such, the common emitter pre-amplifier 12 illustrated in FIG. 3 may be a single-stage amplifier.

Figure 4:
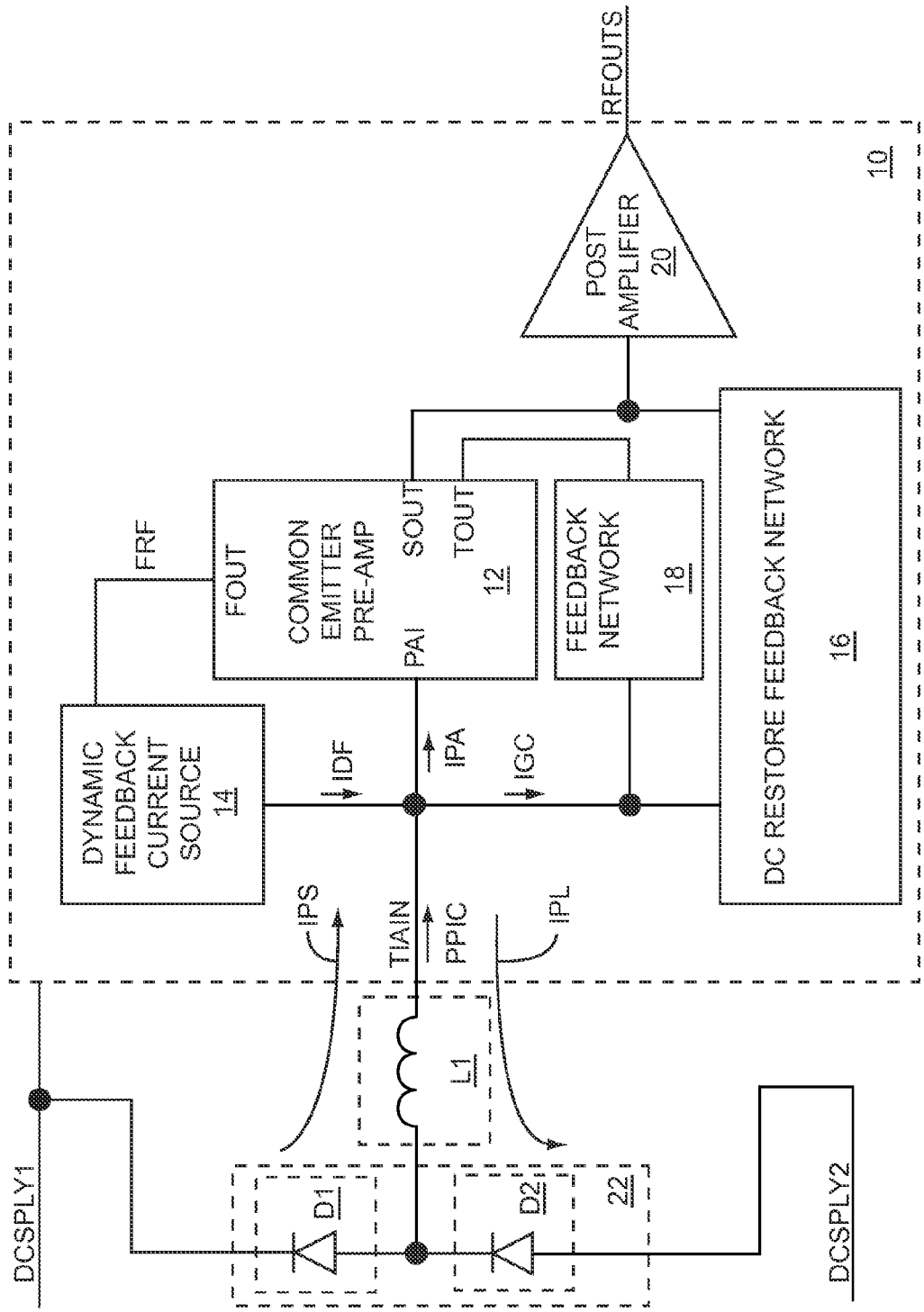
FIG. 4 shows the push-pull TIA according to another embodiment of the push-pull TIA.

FIG. 4 shows the push-pull TIA 10 according to another embodiment of the push-pull TIA 10. The push-pull TIA 10 illustrated in FIG. 4 is similar to the push-pull TIA 10 illustrated in FIG. 2, except in the push-pull TIA 10 illustrated in FIG. 4, a third output TOUT is added. Instead of being coupled to the second output SOUT, the feedback network 18 is coupled to the third output TOUT. The third output TOUT may provide an output signal based on amplifying the push-pull RF input current signal PPIC.

Figure 5:
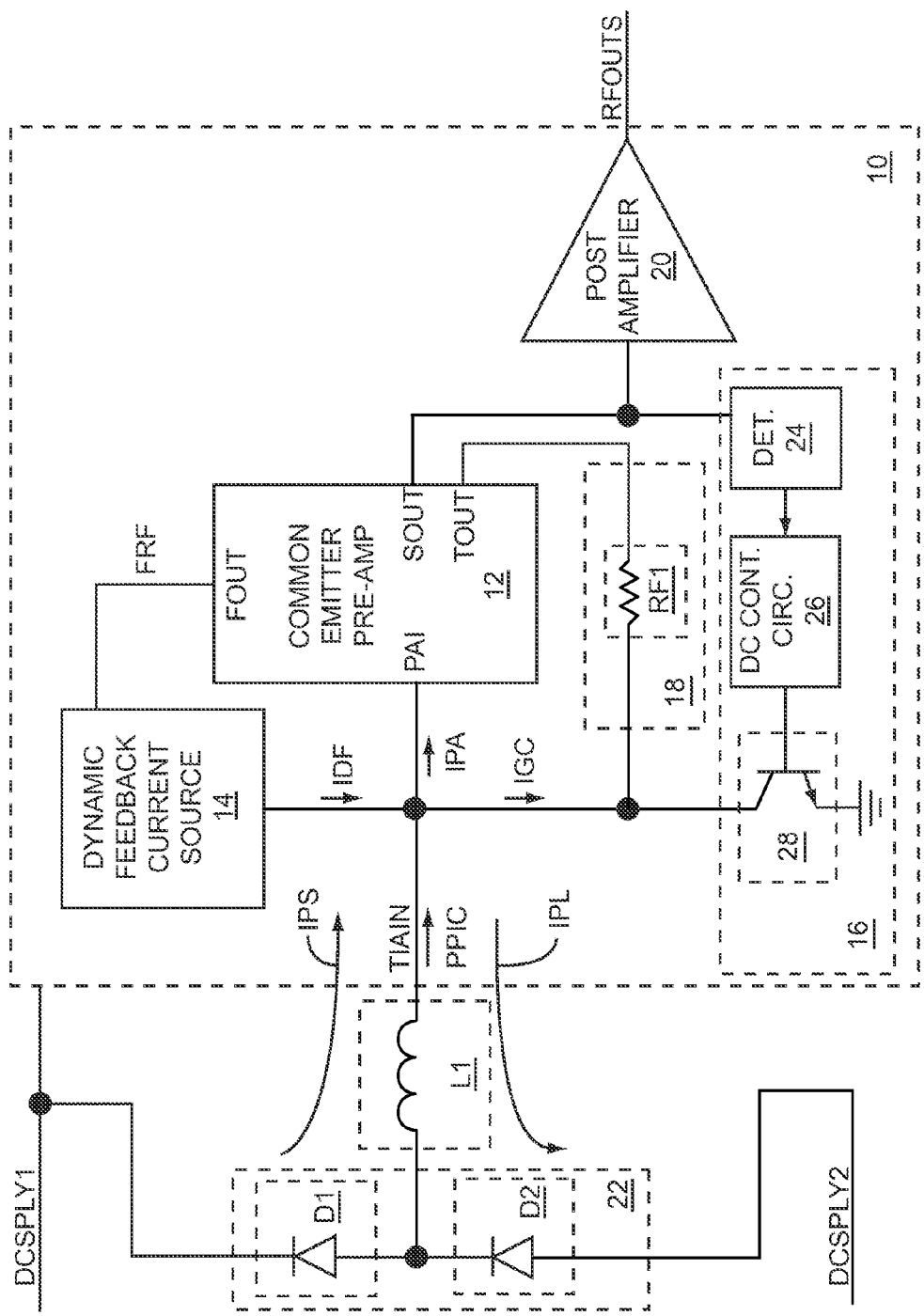
FIG. 5 shows details of a direct current (DC) restore feedback network and a feedback network illustrated in FIG. 4 according to one embodiment of the DC restore feedback network and the feedback network.

FIG. 5 shows details of the DC restore feedback network 16 and the feedback network 18 illustrated in FIG. 4 according to one embodiment of the DC restore feedback network 16 and the feedback network 18. The feedback network 18 includes a first feedback resistive element RF1 coupled between the pre-amplifier input PAI and the third output TOUT. The DC restore feedback network 16 includes a detector 24, DC control circuitry 26, and a first transistor element 28. The detector 24 is coupled to the second output SOUT to receive an amplified signal from the second output SOUT. The DC control circuitry 26 is coupled between the detector 24 and the first transistor element 28 and controls the first transistor element 28 based on a magnitude of the amplified signal from the second output SOUT. The first transistor element 28 comprises a collector, which is coupled to the pre-amplifier input PAI.

Figure 6:
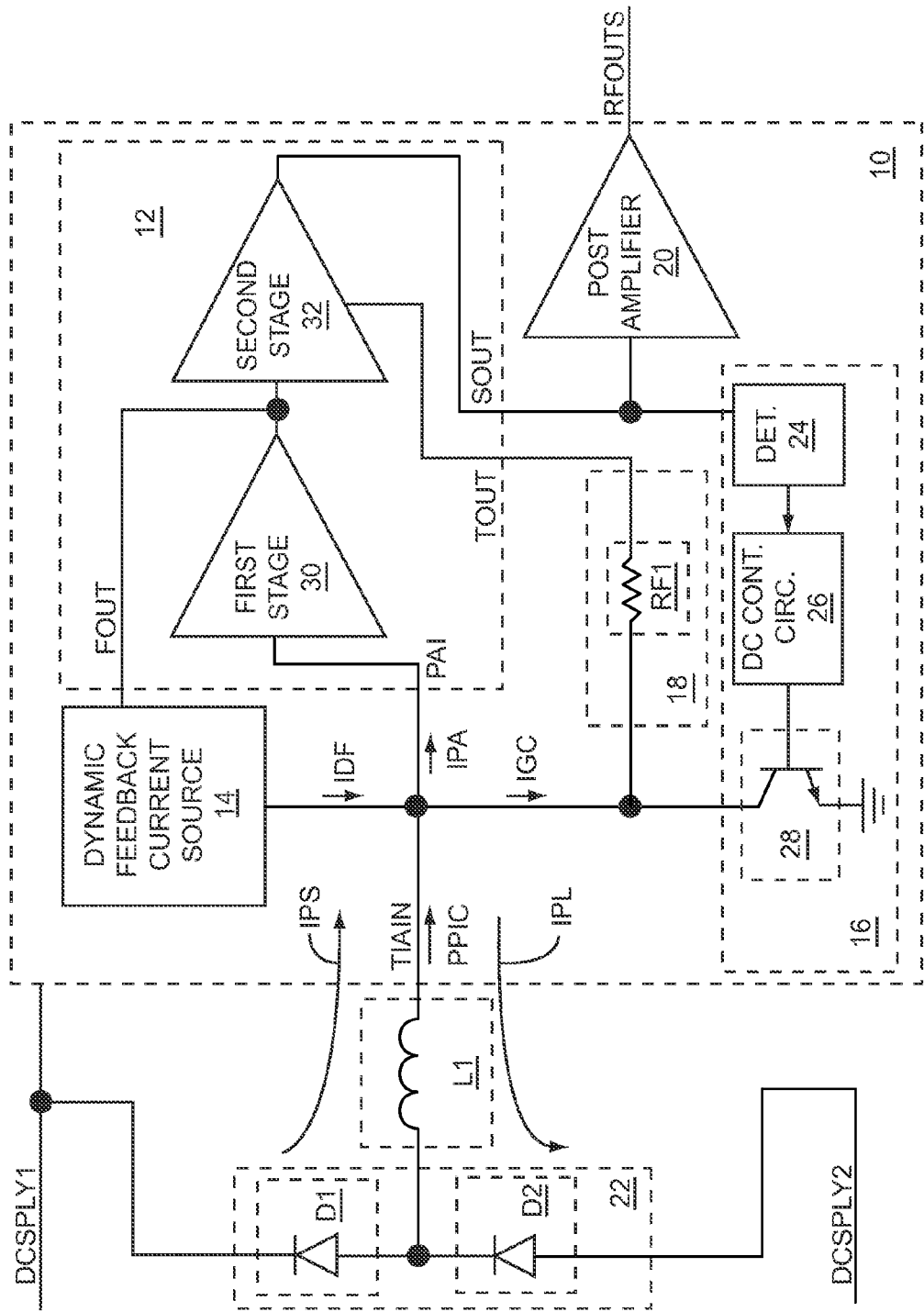
FIG. 6 shows details of a common emitter pre-amplifier illustrated in FIG. 5 according to one embodiment of the common emitter pre-amplifier.

FIG. 6 shows details of the common emitter pre-amplifier 12 illustrated in FIG. 5 according to one embodiment of the common emitter pre-amplifier 12. The common emitter pre-amplifier 12 includes a first stage 30 and a second stage 32. An input to the first stage 30 is coupled to the pre-amplifier input PAI and an output from the first stage 30 is coupled to the first output FOUT. Further, an input to the second stage 32 is coupled to the first output FOUT, one output from the second stage 32 is coupled to the second output SOUT, and another output from the second stage 32 is coupled to the third output TOUT. The first stage 30 may amplify the push-pull RF input current signal PPIC to provide the first RF signal FRF (FIG. 5) and the second stage 32 may amplify the first RF signal FRF to provide output signals at the second output SOUT and the third output TOUT.

Figure 7:
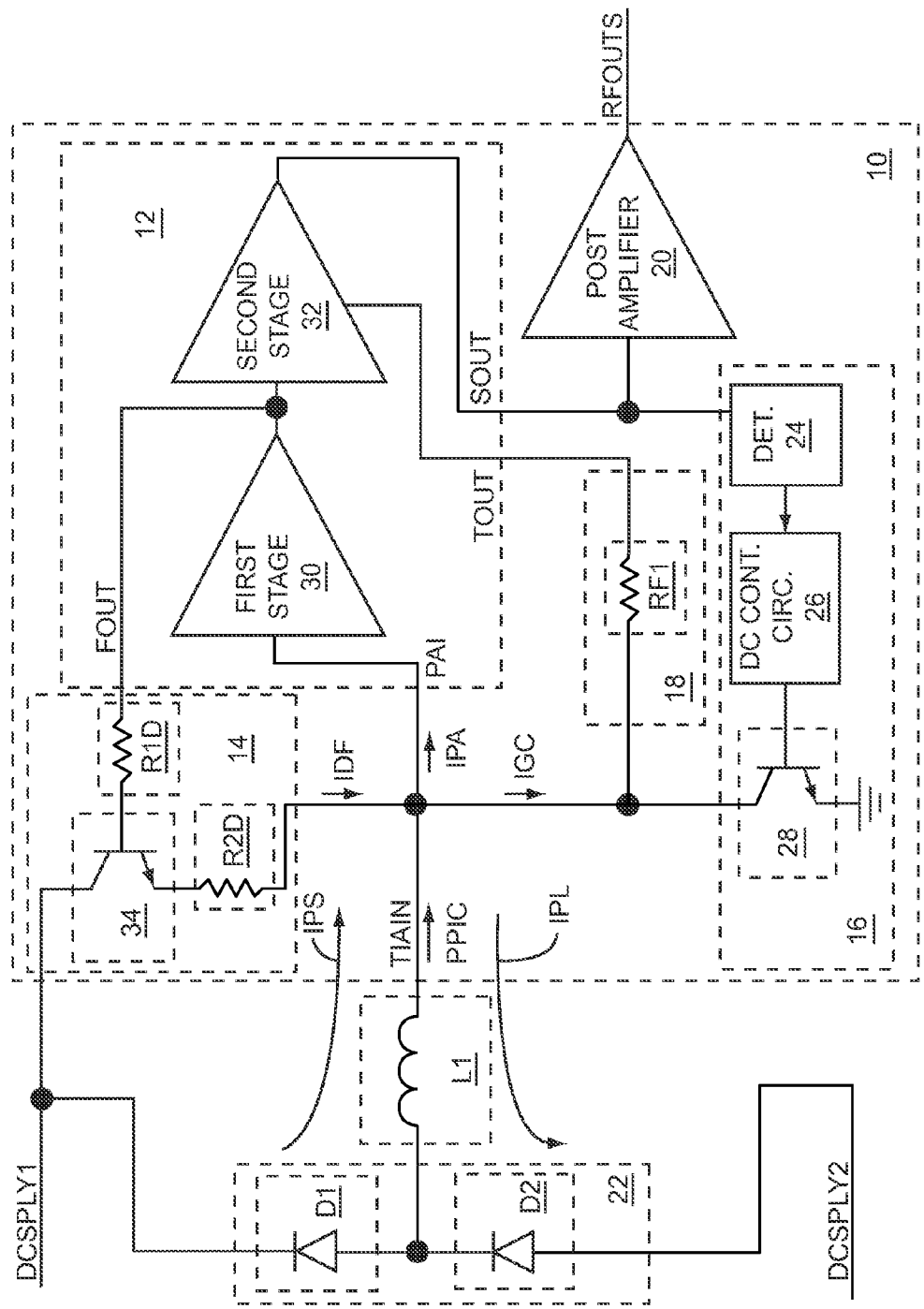
FIG. 7 shows details of a dynamic feedback current source (DFCS) illustrated in FIG. 6 according to one embodiment of the DFCS.

FIG. 7 shows details of the DFCS 14 illustrated in FIG. 6 according to one embodiment of the DFCS 14. The DFCS 14 includes a DFCS transistor element 34, a first DFCS resistive element R1D, and a second DFCS resistive element R2D. A collector of the DFCS transistor element 34 is coupled to the first DC supply DCSPLY1. The first DFCS resistive element R1D is coupled between a base of the DFCS transistor element 34 and the first output FOUT. The second DFCS resistive element R2D is coupled between an emitter of the DFCS transistor element 34 and the pre-amplifier input PAI. The DFCS transistor element 34 may include an NPN transistor element or an N-type metal oxide semiconductor (NMOS) transistor element.

Figure 8:
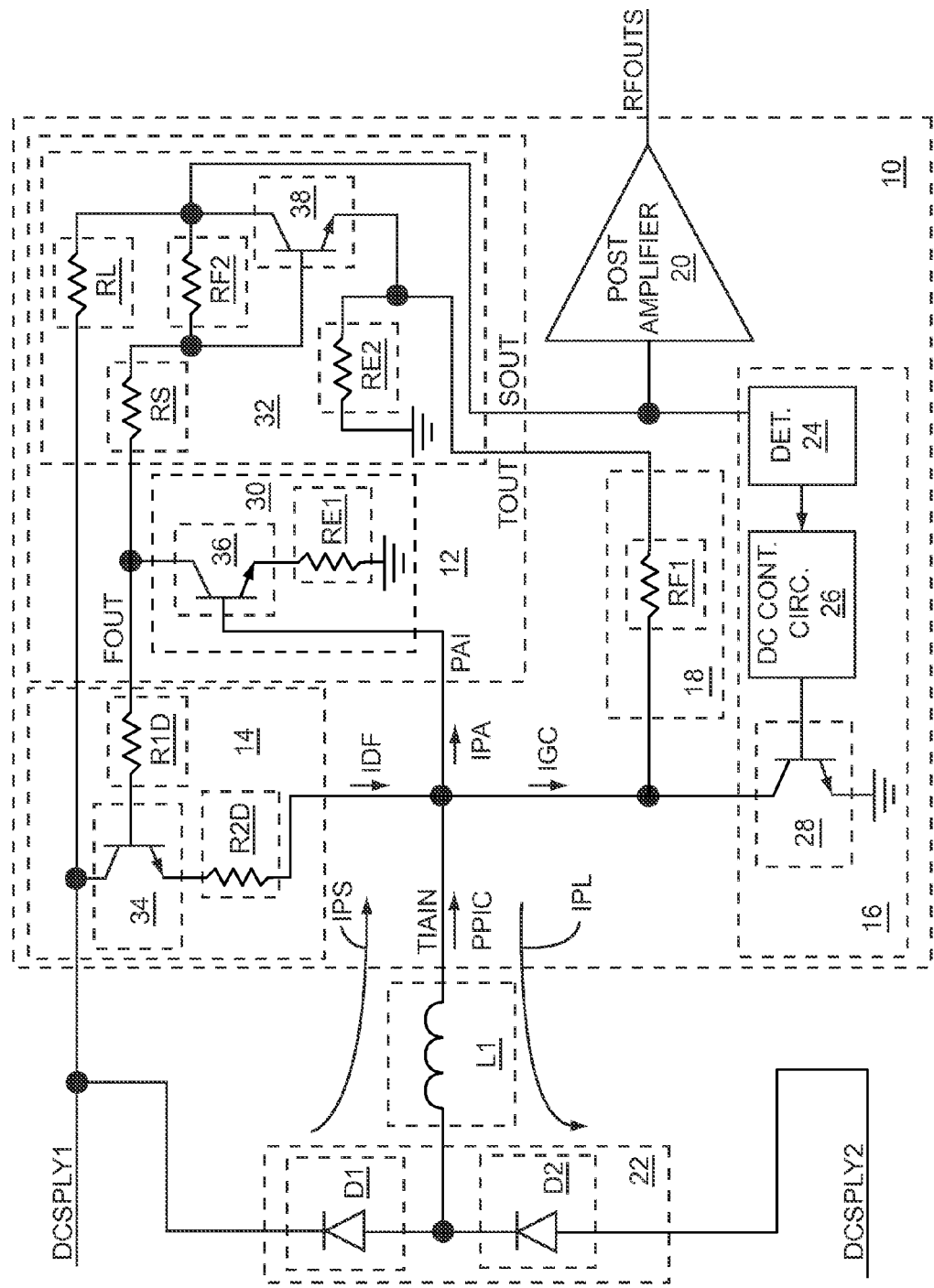
FIG. 8 shows details of a first stage of the common emitter pre-amplifier and a second stage of the common emitter pre-amplifier according to one embodiment of the first stage and the second stage.

FIG. 8 shows details of the first stage 30 of the common emitter pre-amplifier 12 and the second stage 32 of the common emitter pre-amplifier 12 illustrated in FIG. 7 according to one embodiment of the first stage 30 and the second stage 32. The first stage 30 includes a first stage transistor element 36 and a first emitter resistive element RE1. A collector of the first stage transistor element 36 is coupled to the first output FOUT. A base of the first stage transistor element 36 is coupled to the pre-amplifier input PAI. The first emitter resistive element RE1 is coupled between an emitter of the first stage transistor element 36 and ground. The first stage transistor element 36 may be a common emitter NPN transistor element.

The second stage 32 includes a second stage transistor element 38, a second stage resistive element RS, a second feedback resistive element RF2, a load resistive element RL, and a second emitter resistive element RE2. An emitter of the second stage transistor element 38 is coupled to the third output TOUT. A collector of the second stage transistor element 38 is coupled to the second output SOUT. The second stage resistive element RS is coupled between a base of the second stage transistor element 38 and the first output FOUT. The second feedback resistive element RF2 is coupled between the base of the second stage transistor element 38 and the collector of the second stage transistor element 38. The load resistive element RL is coupled between the collector of the second stage transistor element 38 and the first DC supply DCSPLY1. The second emitter resistive element RE2 is coupled between the emitter of the second stage transistor element 38 and ground.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A push-pull transimpedance amplifier (TIA) adapted to receive a push-pull radio frequency (RF) input current signal having a push current and a pull current, and comprising:
   a common emitter pre-amplifier adapted to:
   receive at least a portion of the push current; and
   provide a first RF signal based on amplifying the push-pull RF input current signal; and
   a dynamic feedback current source (DFCS) adapted to provide at least a portion of the pull current based on the first RF signal and directly coupled between the TIA input and the first output,
   wherein the push-pull TIA is adapted to provide an RF output signal based on amplifying the push-pull RF input current signal.

2. The push-pull TIA of claim 1 wherein:
   the push-pull TIA comprises a TIA input adapted to receive the push-pull RF input current signal; and
   the common emitter pre-amplifier comprises:
   a pre-amplifier input coupled to the TIA input and adapted to receive the at least the portion of the push current; and
   a first output adapted to provide the first RF signal.

3. The push-pull TIA of claim 2 wherein the DFCS detects a polarity of the first RF signal and provides the at least the portion of the pull current based on the detected polarity of the first RF signal.

4. The push-pull TIA of claim 3 wherein the DFCS comprises a DFCS transistor element comprising:
   a base coupled to the first output;
   an emitter coupled to the pre-amplifier input; and
   one selected from a group consisting of an NPN transistor element and an N-type metal oxide semiconductor (NMOS) transistor element.

5. The push-pull TIA of claim 4 wherein the DFCS further comprises:
   a first DFCS resistive element coupled between the base of the DFCS transistor element and the first output; and
   a second DFCS resistive element coupled between the emitter of the DFCS transistor element and the pre-amplifier input.

6. The push-pull TIA of claim 4 wherein the DFCS further comprises a first DFCS resistive element coupled between the emitter of the DFCS transistor element and the pre-amplifier input.

7. The push-pull TIA of claim 2 further comprising a direct current (DC) restore feedback network coupled between the pre-amplifier input and an output of the common emitter pre-amplifier, such that the DC restore feedback network is adapted to provide DC leveling of the common emitter pre-amplifier as a magnitude of the push-pull RF input current signal increases.

8. The push-pull TIA of claim 7 wherein the DC restore feedback network comprises:
 a detector coupled to the output of the common emitter pre-amplifier and adapted to receive and detect an amplified signal from the output of the common emitter pre-amplifier;
 DC control circuitry coupled between the detector and a first transistor element and adapted to control the first transistor element based on a magnitude of the amplified signal; and
 the first transistor element comprising a collector, which is coupled to the pre-amplifier input.

9. The push-pull TIA of claim 7 wherein the output of the common emitter pre-amplifier is the first output and an amplified signal from the output of the common emitter pre-amplifier is the first RF signal.

10. The push-pull TIA of claim 7 wherein the output of the common emitter pre-amplifier is a second output.

11. The push-pull TIA of claim 2 wherein the common emitter pre-amplifier comprises:
 a first stage having an input, which is coupled to the pre-amplifier input, and an output, which is coupled to the first output; and
 a second stage having an input, which is coupled to the first output, and one output, which is coupled to a second output of the common emitter pre-amplifier,
 wherein the first stage amplifies the push-pull RF input current signal to provide the first RF signal.

12. The push-pull TIA of claim 11 wherein:
 the first stage comprises a first stage transistor element comprising:
 a base coupled to the pre-amplifier input; and
 a collector coupled to the first output; and
 the second stage comprises a second stage transistor element comprising:
 a base coupled to the first output; and
 a collector coupled to the second output,
 wherein the first stage transistor element is a common emitter NPN transistor element.

13. The push-pull TIA of claim 12 wherein the second stage further comprises:
 a second stage resistive element coupled between the first output and the base of the second stage transistor element; and
 a feedback resistive element coupled between the base of the second stage transistor element and the collector of the second stage transistor element.

14. The push-pull TIA of claim 12 wherein the second stage transistor element further comprises an emitter coupled to a third output of the common emitter pre-amplifier.

15. The push-pull TIA of claim 1 wherein the push-pull TIA is adapted to provide linear amplification of the push-pull RF input current signal.

16. The push-pull TIA of claim 15 wherein the push-pull TIA is further adapted to provide non-saturated linear amplification of the push-pull RF input current signal.

17. The push-pull TIA of claim 16 wherein an operating frequency of the push-pull RF input current signal is greater than about 100 gigahertz.

18. The push-pull TIA of claim 1 wherein an operating frequency of the push-pull RF input current signal is greater than about 100 gigahertz.

19. The push-pull TIA of claim 1 wherein the push-pull TIA is adapted to operate in compression, such that a portion of the push-pull RF input current signal saturates.

20. The push-pull TIA of claim 1 wherein a push-pull photo-detector provides the push-pull RF input current signal.

21. The push-pull TIA of claim 1 further comprising a post amplifier coupled to the common emitter pre-amplifier and adapted to receive and amplify an amplified signal from the common emitter pre-amplifier to provide the RF output signal.

22. The push-pull TIA of claim 1 wherein the DFCS comprises a DFCS transistor element comprising:
 a base adapted to receive the first RF signal;
 an emitter adapted to provide the at least the portion of the pull current; and
 one selected from a group consisting of an NPN transistor element and an N-type metal oxide semiconductor (NMOS) transistor element.

23. A method comprising:
 receiving a push-pull radio frequency (RF) input current signal having a push current and a pull current;
 providing a common emitter pre-amplifier associated with a push-pull transimpedance amplifier (TIA);
 receiving at least a portion of the push current;
 amplifying the push-pull RF input current signal to provide a first RF signal;
 providing at least a portion of the pull current based on the first RF signal through a dynamic feedback current source (DFCS) directly coupled between a TIA input and a first output; and
 providing an RF output signal based on amplifying the push-pull RF input current signal.

\* \* \* \* \*